US007010128B1

(12) United States Patent
Heed et al.

(10) Patent No.: US 7,010,128 B1
(45) Date of Patent: *Mar. 7, 2006

(54) METHOD OF PROCESSING AND REPRODUCING AN AUDIO STEREO SIGNAL AND AN AUDIO STEREO SIGNAL REPRODUCTION SYSTEM

(75) Inventors: Christer Heed, Huddinge (SE); Fredrik Gunnarsson, Huddinge (SE)

(73) Assignee: Embracing Sound Experience AB, Uppsala (SE)

( * ) Notice: Subject to any disclaimer, the term of this patent is extended or adjusted under 35 U.S.C. 154(b) by 0 days.

This patent is subject to a terminal disclaimer.

(21) Appl. No.: 10/129,616

(22) PCT Filed: Nov. 25, 1999

(86) PCT No.: PCT/SE99/02193

§ 371 (c)(1), (2), (4) Date: May 8, 2002

(87) PCT Pub. No.: WO01/39547

PCT Pub. Date: May 31, 2001

(51) Int. Cl.
*H04R 5/00* (2006.01)
*H04R 5/02* (2006.01)
*H03G 3/00* (2006.01)

(52) U.S. Cl. ............................ 381/1; 381/303; 381/19; 381/61

(58) Field of Classification Search ................ 381/1–3, 381/10, 61, 99
See application file for complete search history.

(56) References Cited

U.S. PATENT DOCUMENTS

| | | | |
|---|---|---|---|
| 3,892,624 A | 7/1975 | Shimada | |
| 4,596,034 A | 6/1986 | Moncrieff | |
| 4,819,269 A * | 4/1989 | Klayman | 381/307 |
| 5,553,147 A | 9/1996 | Pineau | |
| 5,579,396 A | 11/1996 | Iida et al. | |
| 5,850,454 A * | 12/1998 | Hawks | 381/1 |
| 5,892,830 A * | 4/1999 | Klayman | 381/1 |
| 6,169,812 B1 * | 1/2001 | Miller | 381/300 |

FOREIGN PATENT DOCUMENTS

| | | |
|---|---|---|
| EP | 0 773 702 A2 | 5/1997 |
| WO | 97/30566 A1 | 8/1997 |

* cited by examiner

*Primary Examiner*—Laura A. Grier
(74) *Attorney, Agent, or Firm*—Birch, Stewart, Kolasch & Birch, LLP

(57) ABSTRACT

A method of processing and reproducing an input audio stereo signal in an audio signal processing system comprises the steps of (1) splitting a side signal into a first and a second intermediate signal, where the first intermediate signal is equal to the side signal and the second intermediate signal is equal to the first intermediate signal phase shifted 180°, (2) attenuating the mid signal by a factor a which compensates for imperfections in the balance between the mid and side signals appearing in the audio reproduction stage, (3) adding the attenuated mid signal to both of the first and second intermediate signals, so as to form the output audio stereo signal, and (4) directing the output stereo signal to an audio stereo signal reproduction system, comprising a pair of loudspeaker units located in close proximity to each other. A suitable audio stereo signal reproduction system comprises a pair of loudspeaker units (2', 2") having a common baffle and each pair of loudspeaker units (2', 2") is positionable as a unitary assembly in close proximity to each other.

12 Claims, 2 Drawing Sheets

METHOD OF PROCESSING AND REPRODUCING AN AUDIO STEREO SIGNAL AND AN AUDIO STEREO SIGNAL REPRODUCTION SYSTEM

This application is the national phase under 35 U.S.C. § 371 of PCT International Application No. PCT/SE99/02193 which has an International filing date of Nov. 25, 1999, which designated the United States of America.

FIELD OF THE INVENTION

The present invention relates in general to a method of processing and reproducing an audio stereo signal and to a corresponding audio stereo signal reproduction system. More particularly, the present invention relates to an audio stereo signal reproduction system with a very narrow distance between right and left side loudspeakers, and to a method of processing an audio stereo signal for retaining the apparent stereo width in the perceived sound picture emitted from such a reproduction system.

BACKGROUND OF THE INVENTION

A large number of methods and systems exist intended for faithful reproduction of the sound experienced by a listener at the recording position. The only one of these that is able to truly reproduce the stereo effect, i.e. the impression of the different sound sources originating from different spatial positions, is using stereo headphones. This method is however not suitable for reproduction of stereo sound to an audience consisting of more than one listener. To overcome this drawback, audio stereo reproduction systems comprising two, or more, loudspeakers are used for reproducing stereo sound to an audience. Most of these systems are based on a pair of widely spaced loudspeakers, and true reproduction of the stereo effect, both in terms of relative intensity between the sound perceived by the listeners' two ears and the time difference between these, can be perceived only at a single position in relation to the loudspeakers. This implies that only one listener in an audience can experience a truly correct stereo effect. All other members of the audience will therefore experience a distorted stereo effect. Different ways to widen the area over which the perceived stereo impression is nearly correct have been attempted, with varying degrees of success.

Physically separating the two loudspeakers a distance large enough for enabling reproduction of the stereo impression to at least one listener is generally impractical, and in certain cases impossible. Examples of such cases is single unit stereo radio or CD players with integral loudspeakers, or reproduction of stereo sound to several listeners in cars or small rooms. Artificially adjusting the relative intensities of the side and the mid signals, to increase the perceived stereo width might improve the impression of stereo, but will also distort the sound picture. Other methods of improving the perceived stereo effect from narrowly separated loudspeakers have also been suggested, but have proven to give limited effect.

SUMMARY OF THE INVENTION

It is an object of the present invention to provide a method for processing an audio stereo signal, such that it can be reproduced with a high degree of fidelity in the perceived stereo effect over a larger area than possible with previous methods.

It is another object of the present invention to provide a method for processing an audio stereo signal, such that it can be reproduced with a high degree of fidelity in the perceived stereo effect, using a pair of loudspeakers being situated in immediate vicinity of each other.

According to the present invention, the method comprises the steps of splitting the side signal into a first and a second intermediate signal, where said first intermediate signal is equal to the side signal and said second intermediate signal is equal to said first intermediate signal phase shifted 180°, and attenuating the mid signal by a factor $\alpha$. Then the attenuated mid signal is added to both of said first and second intermediate signals, so as to form said output audio stereo signal. Finally, the output stereo signal is directed to an audio stereo signal reproduction system, comprising a pair of loudspeaker units located in close proximity to each other.

It is yet another object of the present invention to provide a loudspeaker system, comprising identical pairs of loudspeaker elements, suited for reproducing an audio stereo signal processed according to the presented method.

According to the present invention, the system comprises a pair of loudspeaker units being acoustically isolated from each other. The loudspeaker elements of said pair of loudspeaker units are positionable as a unitary assembly in close proximity to each other, and each loudspeaker element of each pair of corresponding, identical loudspeaker elements of the two units is mounted at essentially the same height. The loudspeaker elements of at least one of said pairs are mounted in immediate vicinity of each other.

DESCRIPTION OF A PREFERRED EMBODIMENT

Figure 1:
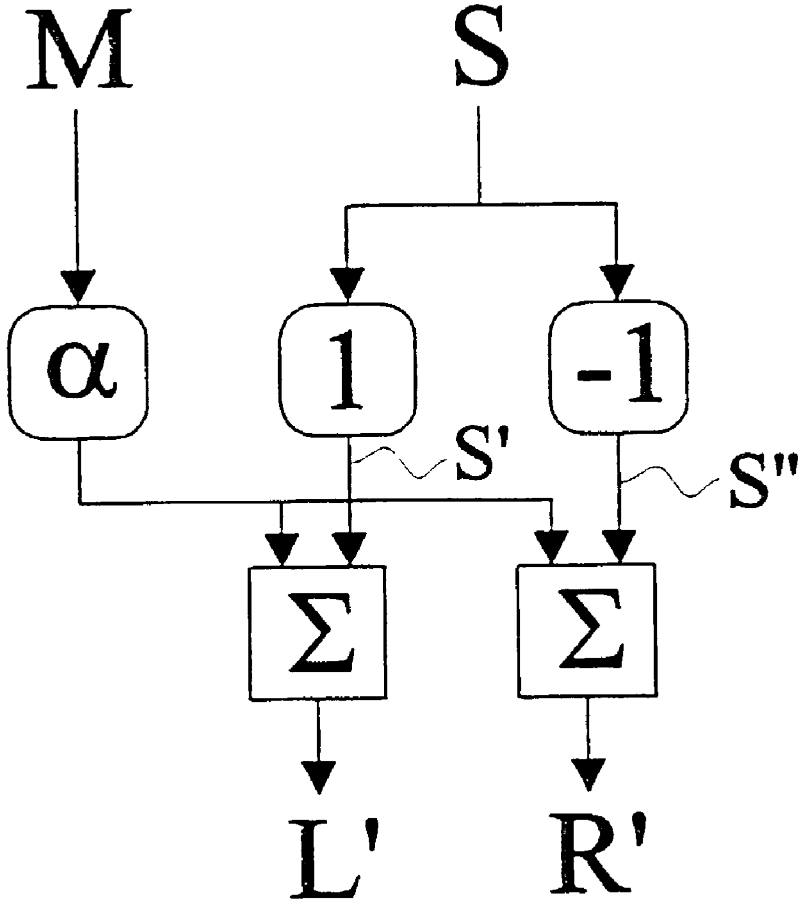
FIG. 1 is a block diagram illustrating the processing method according to the invention.

FIG. 1 illustrates the method of processing an audio stereo signal according to the present invention. The audio stereo signal comprises a mid signal M, and a side signal S, corresponding to the difference between the left and right stereo signals, and the sum of the left and right stereo signals, respectively. Obviously, the method could equivalently be described in terms of left and right side components of an audio stereo signal, but as a matter of convenience, the method is described using the M and S picture only. According to the method, the S signal is split into two parts, one of which is a first intermediate signal S' equal to S, and the other of which is a second intermediate signal S", equal to S' but phase shifted 180°, or inverted, relative to S (and S').

The mid signal M is attenuated a factor $\alpha$, which, assuming the recording system as well as previous and subsequent stereo signal processing and stereo reproducing systems are optimal, would be typically −3 dB. In a general case, however, it is adapted to optimise the stereo effect perceived by the listener, and is allowed to vary in an interval from −1.5 dB to −10 dB. The attenuated mid signal is then added to the first and second intermediate signals S' and S", respectively, and the resulting pair of signals are fed to an audio stereo signal reproduction system. Reproducing the resulting signals by an ordinary audio reproduction system with widely separated loudspeaker elements does however not give a satisfactory result, and only by using the audio stereo signal reproduction system according to the present invention, a stereo effect is reproduced with fidelity.

As the human ear does not appreciate any directionality, i.e. no stereo effect, from sound waves with very long wavelength, the signal processing according to the present invention is meaningless for low frequency sound. Therefore, it might be more cost effective to reproduce the bass using one separate loudspeaker unit only, and not to use the method of processing according to the present invention for that part of the frequency spectrum.

Figure 2:
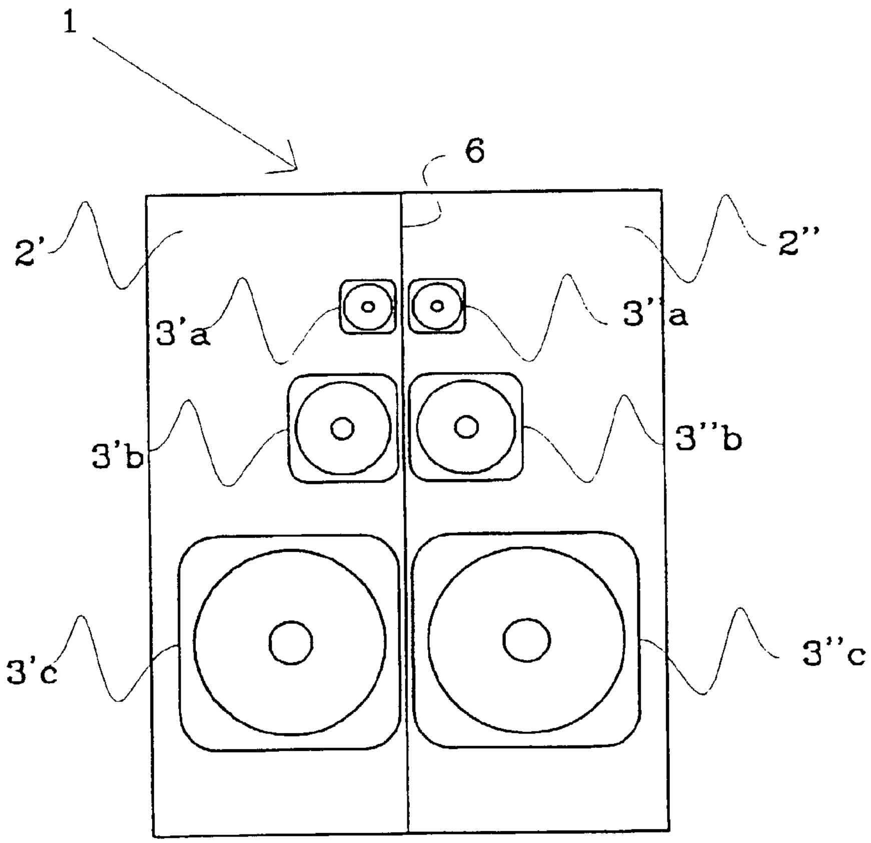
FIG. 2 is a front view of an embodiment of a loudspeaker system.

FIG. 2 shows a preferred embodiment of the audio stereo signal reproduction system according to the present invention. The sound reproduction system 1 comprises two sound reproducing units 2' and 2", each of which comprises one or several, in this case three, loudspeaker elements 3'*a*, 3'*b*, 3'*c* and 3"*a*, 3"*b*, 3"*c*. As shown, the sound reproduction system 1 could include one common baffle 5 with a barrier 6 between the two sound reproducing units 2' and 2", acoustically isolating the resonator volumes of the two units from each other. The term acoustical isolation does here imply that no, or little, sound is transferred from one resonator volume to the other. Alternatively it could consist of two separate units, placed in immediate vicinity of each other, or even being attached to each other. In each instance, each pair of corresponding loudspeaker elements in each of the sound reproducing units should be positioned symmetrically with respect to the separating plane, which in the illustrated embodiment would be defined by the barrier 6, in order to achieve a uniform sound pattern being emitted by each pair of loudspeaker elements 3'*a*, 3"*a*, etc. In addition, each loudspeaker element 3'*a*, 3"*a* etc. of each pair should be positioned as close to the other as practically possible in order to get minimal coloration caused by lobing in the resultant emitted sound pattern due to interference between the loudspeaker elements.

This is achieved when the distance between the loudspeaker elements is smaller than one quarter of the wavelength of the sound being emitted. Achieving this implies that higher frequency loudspeaker elements should be put closer to each other than lower frequency loudspeaker elements.

For sound reproduction systems employing low (first or second) order filters for separating out the parts of the frequency intervals to be reproduced by the mid and high frequency loudspeaker elements, respectively, a comparatively large frequency interval remains which is partially reproduced by both the mid and high frequency loudspeaker elements. This effect will distort the fidelity of the stereo reproduction, and in such a case, it may me preferred to position the mid and high frequency loudspeaker elements in line with each other horizontally. To compensate for the high frequency loudspeaker elements in this case not being positioned as close to each other as possible, the mid signal attenuation factor $\alpha$ is preferably frequency dependent, $\alpha(f)$, where f is the frequency.

Figure 3:
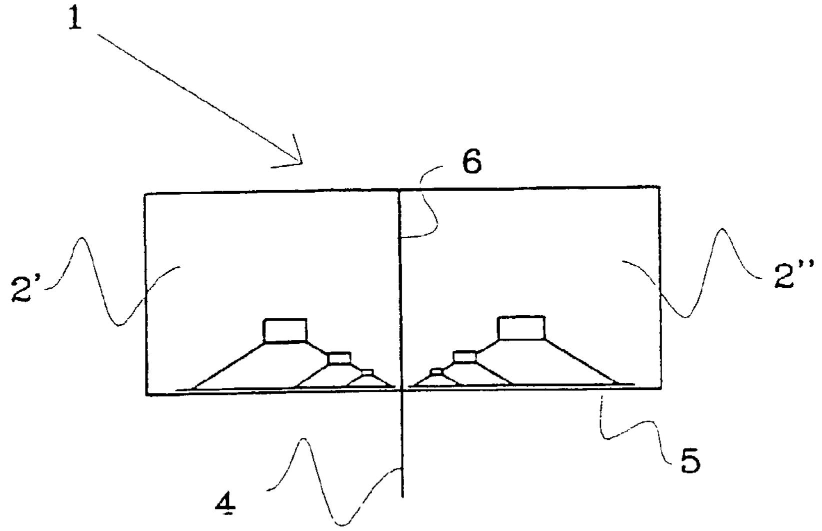
FIG. 3 is a partial cross sectional top view of the loudspeaker system shown in FIG. 2.

In FIG. 3 a plate element 4 positioned between the sound reproducing units 2' and 2" is more clearly illustrated. This optional element serves the purpose of enhancing the perceived stereo effect for the high frequency part of the audio spectrum. The plate element 4 is positioned symmetrically with respect to the sound reproducing units and extends essentially orthogonally from the front surface 5 of the sound reproducing units. Its shape and extension from the front surface are adapted to the acoustical properties of the environment, in which the audio stereo signal reproduction system is to be used, and by the properties of the loudspeaker elements 3. The acoustical properties of the plate element should be neutral and it should preferably have an absorption factor of 0.5 or less at 20 kHz. It may be retractable and extendable in order to optimise the performance of the system when the acoustical properties of the surroundings are varying.

Inasmuch as the present invention is subject to variations, modifications and changes in detail, some of which have been stated herein, it is intended that all matter described throughout this entire specification or shown in the accompanying drawings be interpreted as illustrative and not in a limiting sense.

What is claimed is:

1. A method of processing and reproducing an input audio stereo signal in an audio signal processing system so as to form a processed output audio stereo signal, the input audio stereo signal consisting of at least a part of the frequency range of a mid signal (M) and a side signal (S), the output audio stereo signal being intended for reproduction by a pair of loudspeaker units located in close proximity to each other, comprising the steps of:

splitting the side signal (S) into a first (S') and a second (S") intermediate signal, where said first intermediate signal (S') is equal to the side signal (S) and said second intermediate signal (S") is equal to said first intermediate signal(S') phase shifted 180°, attenuating the mid signal (M) by a factor a which compensates for imperfections in the balance between the mid (M) and side signals (S) appearing in the audio reproduction stage, and adding the attenuated mid signal to both of said first and second intermediate signals (S', S"), so as to form said output audio stereo signal.

2. The method according to claim 1, wherein an attenuation factor $\alpha$ is in the range −1.5 dB to −10 dB.

3. The method according to claim 1, wherein an attenuation factor $\alpha$ is in the range −2.5 dB to −6 dB.

4. The method according to claim 1, wherein an upper part of the frequency range of said input audio stereo signal is processed in said audio signal processing system so as to form an upper frequency output stereo signal.

5. The method according to claim 4, wherein remaining lower parts of the frequency range of the input audio stereo signal are processed so as to form a lower frequency output signal.

6. The method according to claim 5, wherein said upper frequency stereo output signal is fed to a first audio reproduction system having two stereo loudspeaker units, whereas said lower frequency stereo output signal is fed to a second audio reproduction systems.

7. The method according to claim 6, wherein said second audio reproduction system includes only one loudspeaker unit.

8. An audio stereo signal reproduction system, suited for reproducing an audio stereo signal, comprising:

a pair of loudspeaker units (2', 2") acoustically isolated from each other, the units (2', 2") sharing a common front surface (5) and having an effective sound propagation direction being essentially orthogonal to the front surface (5), and loudspeaker elements of said pair of loudspeaker units (2', 2") being identical to each other, wherein the loudspeaker units (2', 2") of said pair are positionable as a unitary assembly in close proximity to each other, and the corresponding loudspeaker elements of each pair of loudspeaker elements (3', 3") of the two units (2', 2") are mounted at essentially the same height, and in immediate vicinity of each other, wherein an input audio stereo signal of the system includes at least a part of the frequency range of a mid signal (M) and a side signal (S), and an output audio stereo signal is intended for reproduction by the pair of loudspeaker units, wherein the side signal (S) is split into a first (S') and a second (S") intermediate signal where said first intermediate signal (S') is equal to the side signal (S) and said second intermediate signal (S") is equal to said first intermediate signal(S') phase shifted 180°, the mid signal (M) is attenuated by a factor a which compensates for imperfections in the balance between the mid (M) and side signals (S) appearing in the audio reproduction stage, and the attenuated mid signal to both of said first and second intermediate signals (S', S"), are added so as to form said output audio stereo signal.

9. The audio stereo signal reproduction system according to claim 8, wherein the loudspeaker elements of each pair of loudspeaker elements (3', 3") of the two units (2', 2") are mounted within a distance from each other of less than one quarter of the shortest wavelength emitted by the loudspeaker elements (3', 3").

10. The audio stereo signal reproduction system according to claim 8, wherein a plate element (4) is disposed centrally between said pair of loudspeaker units (2', 2"), to project from said front surface (5) in said effective sound propagation direction.

11. The audio stereo signal reproduction system according to claim 8, wherein an attenuation factor $\alpha$ is in the range −1.5 dB to −10 dB.

12. The audio stereo signal reproduction system according to claim 8, wherein an attenuation factor $\alpha$ is in the range −2.5 dB to −6 dB.

* * * * *